(12) United States Patent
Kalnitsky et al.

(10) Patent No.: US 6,271,560 B1
(45) Date of Patent: Aug. 7, 2001

(54) SINGLE-POLY EPROM CELL WITH CMOS COMPATIBLE PROGRAMMING VOLTAGES

(75) Inventors: Alexander Kalnitsky, San Francisco; Albert Bergemont, Palo Alto, both of CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/393,617

(22) Filed: Sep. 10, 1999

Related U.S. Application Data

(62) Division of application No. 09/053,309, filed on Apr. 1, 1998, now Pat. No. 6,055,185.

(51) Int. Cl.⁷ .................................................. H01L 29/788
(52) U.S. Cl. ........................................... 257/316; 257/369
(58) Field of Search ..................................... 257/316, 369

(56) References Cited

U.S. PATENT DOCUMENTS

| | | | |
|---|---|---|---|
| 3,774,087 | 11/1973 | Pepper | 317/235 R |
| 3,952,325 | 4/1976 | Beale et al. | 357/23 |
| 4,142,251 | 2/1979 | Mintz | 365/181 |
| 4,203,158 | 5/1980 | Frohman-Bentchkowsky et al. | 365/185 |
| 4,271,420 | 6/1981 | Chikamura et al. | 357/30 |
| 4,661,833 | 4/1987 | Mizumati | 365/185.18 |
| 4,742,491 | 5/1988 | Liang et al. | 365/218 |
| 4,822,750 | 4/1989 | Perlegos et al. | 437/52 |
| 4,931,847 | 6/1990 | Corda | 357/23.5 |
| 4,970,565 | 11/1990 | Wu et al. | 257/318 |
| 5,021,848 | 6/1991 | Chiu | 357/23.5 |
| 5,251,169 | 10/1993 | Josephson | 365/72 |
| 5,416,738 | 5/1995 | Shrivastava | 365/185 |
| 5,557,567 | 9/1996 | Bergemont et al. | 365/185.16 |
| 5,587,949 | 12/1996 | Bergemont et al. | 365/185.24 |
| 5,592,001 | 1/1997 | Asano | 257/316 |
| 5,594,685 | 1/1997 | Bergemont et al. | 365/185.03 |
| 5,612,914 | 3/1997 | Liu et al. | 365/185.26 |
| 5,616,935 | * 4/1997 | Koyama et al. | 257/369 |
| 5,633,518 | 5/1997 | Broze | 257/314 |
| 5,636,162 | 6/1997 | Coffman et al. | 365/185.22 |
| 5,687,118 | 11/1997 | Chang | 365/185.19 |
| 5,761,121 | 6/1998 | Chang | 365/185.14 |
| 5,761,126 | 6/1998 | Chi et al. | 365/185.27 |
| 5,812,452 | 9/1998 | Hoang | 365/185.11 |
| 5,818,761 | 10/1998 | Onakado et al. | 365/185.18 |
| 5,862,085 | 1/1999 | Dejenfelt et al. | 365/185.33 |
| 5,896,315 | 4/1999 | Wong | 365/185.01 |
| 6,055,185 | * 4/2000 | Kalnitsky et al. | 365/185.18 |

OTHER PUBLICATIONS

D. Frohmann–Bentchkowsky, "A Fully Decoded 2048–bit Electrically–Programmable MOS–ROM" 1971, IEEE International Solid–State Circuits Conference, Feb. 18, 1971, ISSCC Digest of Techical Papers, pp. 80–81, Univ. of Pennsylvania.

Geometrical Design Rules, Atlas of IC Technologies, *An Introduction to VLSI Processes*, by W. Maly, pp. 56–59. 1987.

\* cited by examiner

*Primary Examiner*—Mark V. Prenty
(74) *Attorney, Agent, or Firm*—Pillsbury Winthrop LLP

(57) ABSTRACT

The Frohmann-Bentchkowsky EPROM cell is programmed by utilizing biasing voltages which are sufficient to induce hot punchthrough holes to flow from the source region to the drain region, and insufficient to induce avalanche breakdown at the drain-to-semiconductor material junction. In addition, the Frohmann-Bentchkowsky EPROM cell is programmable with CMOS compatible voltages by forming the physical floating gate length of the cell to be less than the minimum physical gate length of the CMOS devices.

4 Claims, 2 Drawing Sheets

SINGLE-POLY EPROM CELL WITH CMOS COMPATIBLE PROGRAMMING VOLTAGES

This is a divisional of application Ser. No. 09/053,309, filed Apr. 1, 1998 now U.S. Pat. No. 6,055,185.

BACKGROUND OF THE INVENTION

1. Field of the Invention

The present invention relates to a single-poly electrically-programmable read-only-memory (EPROM) cell and, more particularly, to a single-poly EPROM cell with CMOS compatible programming voltages.

2. Description of the Related Art

In the early 1970s, an electrically-programmable read-only-memory (EPROM) cell based on a p-channel MOS transistor with a completely isolated gate was introduced by D. Frohmann-Bentchkowsky (see "A Fully Decoded 2048-bit Electrically Programmable MOS-ROM", IEEE ISSCC Digest of Technical Papers, p.80, 1971).

FIG. 1 shows a cross-sectional view that illustrates a Frohmann-Bentchkowsky EPROM memory cell 10. As shown in FIG. 1, EPROM cell 10 includes spaced-apart p-type source and drain regions 16 and 18, respectively, which are formed in an n-type well 14 which, in turn, is formed in a p-type substrate 12. (Source and drain regions 16 and 18 may alternately be formed in an n-type substrate).

In addition, cell 10 also includes a channel region 20 which is defined between source and drain regions 16 and 18, and a layer of gate oxide 22 which is formed over channel region 20. Cell 10 further includes a gate 24 which is formed over gate oxide layer 22, and a layer of insulation material 26 which, along with gate oxide layer 22, completely encapsulates gate 24. Since gate 24 is completely isolated, it is commonly referred to as a floating gate.

In operation, cell 10 is programmed by applying biasing voltages to well 14 and drain 18 which are sufficient to induce avalanche breakdown. For example, avalanche breakdown is induced by applying ground to well 14 and a negative breakdown voltage to drain region 18 (while either grounding or floating source region 16), or by applying a positive breakdown voltage to well 14 and ground to drain region 18 (while floating or applying the positive breakdown voltage to source region 16).

The biasing voltages which are sufficient to induce avalanche breakdown establish a strong electric field across the drain-to-well junction depletion region. The strong junction electric field accelerates electrons in the junction depletion region (which are formed from thermally-generated electron-hole pairs) into hot electrons which then have ionizing collisions with the lattice, thereby forming "substrate hot electrons".

A number of these substrate hot electrons penetrate gate oxide layer 22 and begin accumulating on floating gate 24 due to the relatively positive potential on floating gate 24 with respect to drain region 18.

The potential on floating gate 24 is defined by the voltages which are coupled to floating gate 24 from well 14, source region 16, and drain region 18, and the surface area of floating gate 24 that is formed over these regions. Thus, since floating gate 24 is only marginally formed over source and drain regions 16 and 18, the potential on floating gate 24 is primarily determined by the voltage applied to well 14.

Therefore, when ground is applied to well 14 (and source region 16), and the negative breakdown voltage is applied to drain region 18 during programming, the potential on floating gate 24 is slightly less than ground which, in turn, is relatively positive with respect to the negative breakdown voltage applied to drain region 18.

(If a positive breakdown voltage is applied to well 14 and ground is applied to drain region 18, then floating gate 24 will have a potential slightly less than the positive breakdown voltage which, in turn, is positive with respect to ground which is applied to drain region 18).

Cell 10 is read by applying ground to well 14 and source region 16, and a read voltage to drain region 18. If cell 10 has been programmed, the negative charge on floating gate 24 causes channel region 20 to invert (which inversion is permanent as long as the negative charge remains on floating gate 24). As a result, the read biasing voltages applied to source and drain regions 16 and 18 cause a current to flow from drain region 18 to source region 16.

On the other hand, if cell 10 has not been programmed, the slight negative charge which is coupled to floating gate 24 is insufficient to invert channel region 20. As a result, channel region 20 remains in accumulation. Thus, when the read biasing voltages are applied to source and drain regions 16 and 18, no current is able to flow.

EPROM cell 10 is erased by irradiating cell 10 with ultraviolet (UV) light to remove the electrons. The UV light increases the energy of the electrons which, in turn, allows the electrons to penetrate the surrounding layers of oxide.

Thus, the Frohmann-Bentchkowsky cell utilizes a p-channel MOS-type device to inject electrons onto the floating gate (as contrasted with more recent EPROM devices that use an n-channel MOS-type device to inject electrons onto the floating gate).

Although some of the first EPROMs sold by Intel™ were based on the Frohmann-Bentchkowsky cell, the cell was soon replaced with alternate cell structures, and has since fallen into relative obscurity.

SUMMARY OF THE INVENTION

The Frohmann-Bentchkowsky memory cell is an electrically-programmable read-only-memory (EPROM) cell that includes spaced-apart source and drain regions which are formed in a substrate material, and a channel region which is defined between the source and drain regions.

In addition, the cell also includes a layer of gate oxide which is formed over the channel region, and a floating gate which is formed over the gate oxide layer. A layer of insulation material, in turn, is formed on the floating gate so that the layer of insulation material and the layer of gate oxide completely encapsulate the floating gate.

Conventionally, the Frohmann-Bentchkowsky EPROM cell is programmed by applying voltages to the drain and substrate which are sufficient to induce avalanche breakdown.

In accordance with the present invention, the Frohmann-Bentchkowsky EPROM cell is programmed by applying a first voltage to the semiconductor material, and a second voltage to the source. In addition, a third voltage is applied to the drain which is sufficient to induce hot punchthrough holes to flow from the source region to the drain region, and insufficient to induce avalanche breakdown at the drain-to-semiconductor material junction.

One of the advantages to using hot punchthrough holes instead of the avalanche effect is that the Frohmann-Bentchkowsky EPROM cell is programmable with CMOS compatible voltages.

A CMOS logic circuit in accordance with the present invention includes a memory cell which is formed in a semiconductor material of a first conductivity type, and a transistor which is formed in a semiconductor material of a second conductivity type.

The memory cell includes spaced-apart source and drain regions of a second conductivity type which are formed in the semiconductor material of the first conductivity type, and a channel region which is defined between the source and drain regions. In addition, the memory cell also includes a layer of gate oxide which is formed over the channel region, and a floating gate which is formed over the layer of gate oxide. The floating gate, in turn, has a physical gate length.

The transistor includes spaced-apart source and drain regions of the first conductivity type which are formed in the semiconductor material of the second conductivity type, and a channel region which is defined between the source and drain regions of the transistor. Further, the transistor also includes a layer of gate oxide which is formed over the channel region of the transistor, and a gate which is formed over the layer of gate oxide of the transistor. In accordance with the present invention, the gate of the transistor has a physical gate length that is greater than the physical gate length of the memory cell.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
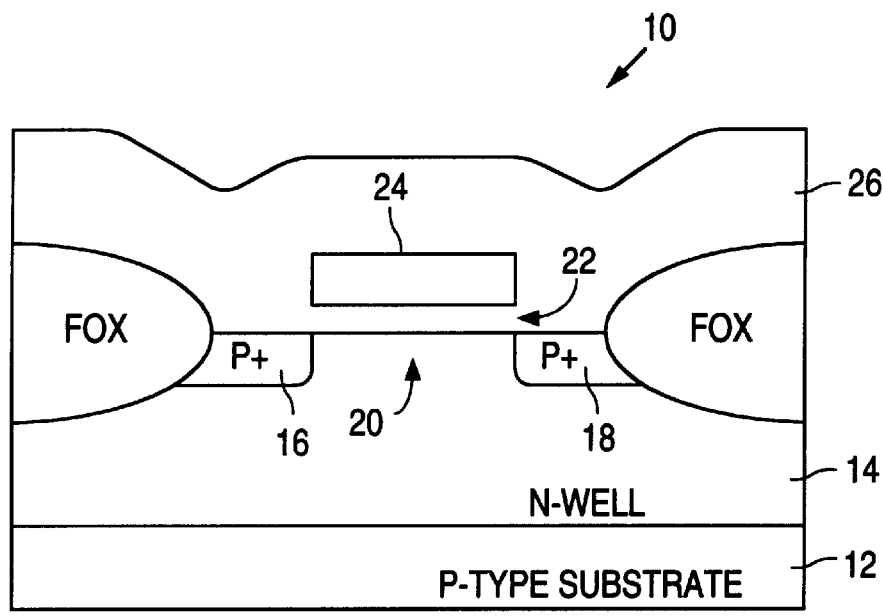
FIG. 1 is a cross-sectional view illustrating a Frohmann-Bentchkowsky EPROM memory cell 10.

In accordance with the present invention, the Frohmann-Bentchkowsky EPROM cell of FIG. 1 is programmed by applying biasing voltages to well 14, source region 16, and drain region 18 which are sufficient to induce holes to flow from source region 16 to drain region 18 with enough kinetic energy to have ionizing collisions with the lattice, and insufficient to induce avalanche breakdown at the drain-to-well junction.

Holes will flow from source region 16 to drain region 18 when the depletion region associated with the reverse-biased drain-to-well junction extends over and overlaps with the depletion region associated with the source-to-well junction.

When the drain and source depletion regions overlap, which is known as punchthrough, the drain-to-source electric field reduces the potential energy barrier at the source-to-well junction. The reduced potential energy barrier, in turn, allows the holes in source region 16 to overcome the barrier, thereby producing a hole flow below the surface of the device from source region 16 to drain region 18.

When the holes flowing to drain region 18 are hot, the holes have ionizing collisions with the lattice that form substrate hot electrons. Some of the substrate hot electrons, in turn, penetrate the layer of gate oxide 22 and accumulate on floating gate 24. Since most of the substrate hot electrons are formed directly under floating gate 24 rather than at the drain-to-well junction, the programming of the present invention is more efficient that the avalanche-breakdown programming of the prior art.

Whether the depletion region associated with the reverse-biased drain-to-well junction extends over and overlaps with the source-to-well depletion region, and whether the holes become "hot" as they flow to drain region 18, i.e., whether the holes have enough kinetic energy to have ionizing collisions with the lattice, is a function of the well doping concentration, the effective channel length, and the voltages applied to well 14, source region 16, and drain region 18.

Conventionally, semiconductor wells typically have an n-type dopant concentration in the range of $1\times10^{16}$ to $1\times10^{18}$ atoms/cm$^3$ for devices based on a 0.35 micron design rule, and $1\times10^6$ to $1\times10^{19}$ atoms/cm$^3$ for devices based on a 0.25 micron design rule, where the highest concentrations are usually found close to the silicon-oxide interface.

(As noted above, source and drain regions 16 and 18 may alternately be formed in a substrate rather than a well. Semiconductor substrates typically have an n-type dopant concentration in the range of $1\times10^{16}$ to $1\times10^{18}$ atoms/cm$^3$ for devices based on a 0.35 micron design rule, and $1\times10^{16}$ to $1\times10^{19}$ atoms/cm$^3$ for devices based on a 0.25 micron design rule, where the highest concentrations are usually found close to the silicon-oxide interface.)

Increasing the dopant concentration above these conventional levels reduces the strength of the drain-to-source electric field, and the breakdown voltage of the drain-to-substrate junction. Thus, cell 10 preferably utilizes conventional substrate and well doping concentrations.

Conventional source and drain regions, in turn, typically have a p-type dopant concentration in the range of $1\times10^{19}$ to $1\times10^{21}$ atoms/cm$^3$ for devices based on a 0.35 micron design rule, and $1\times10^{19}$ to $1\times10^{21}$ atoms/cm$^3$ for devices based on a 0.25 micron design rule. As a result, for a conventionally-doped p-type drain region formed in a conventionally doped n-type substrate, the typical drain-to-well breakdown voltage is approximately 6–12 volts, depending on the specifics of the technology that is used.

With respect to the effective channel length, the channel length is defined by the physical gate length, while the effective channel length is defined by the amount of lateral diffusion that occurs after the source and drain regions have been formed.

For a given fabrication process, the amount of lateral diffusion, which is relatively minor, is approximately constant. Thus, although the effective channel length is less than the physical gate length, the effective channel length is defined by the physical gate length.

In the present invention, cell 10 is formed to have a physical gate length which allows hot punchthrough holes to flow from source region 16 to drain region 18 when the drain-to-source voltage is less than the drain-to-well breakdown voltage.

As a general rule, shorter channel devices, e.g., 0.25 and 0.35 micron devices, use higher substrate doping densities and shallower junctions than longer channel devices, thereby making the source and drain junctions more abrupt. These abrupt junctions reduce the junction breakdown voltages, while a higher channel doping increases the voltage required to induce punchthrough. The decrease in gate length does not affect the junction breakdown, but greatly reduces the voltage required to induce punchthrough.

Thus, with respect to the biasing voltages, ground is applied to drain 18, while a positive programming voltage is applied to well 14 and source 16 which is sufficient to induce holes to flow from source region 16 to drain region 18 with enough kinetic energy to have ionizing collisions with the lattice, and insufficient to induce avalanche breakdown at the drain-to-well junction.

For example, with a physical gate length of 0.35 microns based on a 0.35 micron design rule or technology (and conventional doping concentrations for the well, source, and drain), holes flowing from source region 16 to drain region 18 become hot when the voltage applied to well 14 and source region 16 is equal to approximately 5.75 volts.

Similarly, with a physical gate length of 0.25 microns based on a 0.25 micron design rule or technology (and conventional doping concentrations for the well, source, and drain), holes flowing from source region 16 to drain region 18 become hot when the voltage applied to well 14 and source region 16 is equal to approximately 4.5 volts.

In addition to the above, ground may alternately be applied to well 14 and source 16 while a negative programming voltage is applied to drain 18 which is sufficient to induce holes to flow from source region 16 to drain region 18 with enough kinetic energy to have ionizing collisions with the lattice, and insufficient to induce avalanche breakdown at the drain-to-well junction.

Further, the voltages applied to well 14 and source region 16 need not be the same. The voltage applied to source region 16 may be less than the voltage applied to well 14, thereby reverse biasing the source-to-well junction, or greater than the voltage applied to well 14, thereby forward biasing the source-to-well junction. A forward bias of not more than approximately 0.7 volts should increase hole injection into the depletion region, and may increase programming efficiency.

Thus, the present invention utilizes hot punchthrough holes, which are generated at voltages which are significantly less than the voltages required to breakdown the drain-to-well junction, to inject electrons onto the floating gate.

In further accordance with the present invention, cell 10 is integratable into a conventional CMOS logic circuit by using a physical gate length which is less than the physical gate length of the MOS transistors in the CMOS circuit (with current generation CMOS processes, the NMOS and PMOS physical gate lengths are typically the same).

Figure 2:
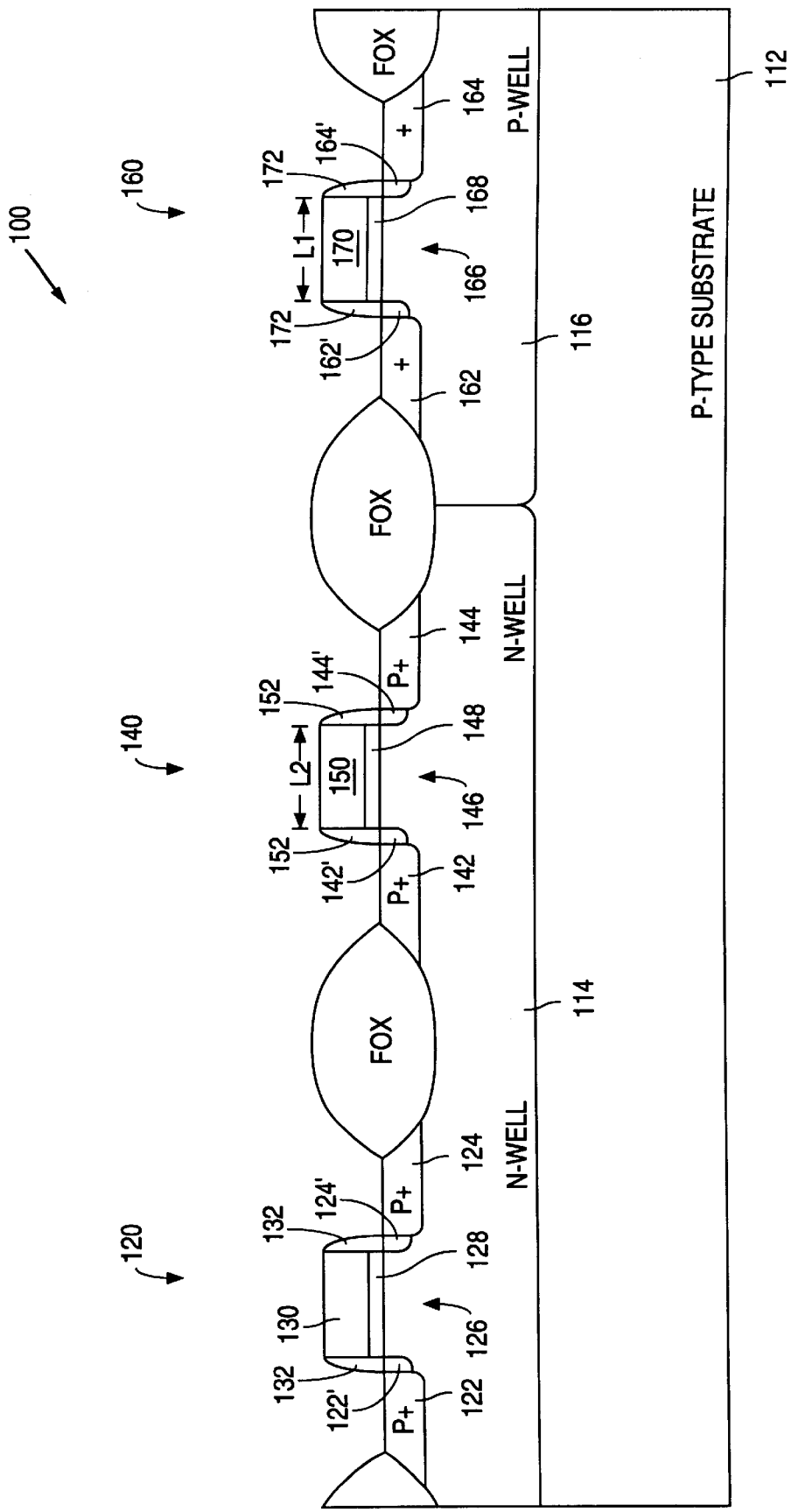
FIG. 2 is a cross-sectional view illustrating a CMOS logic circuit 100 in accordance with the present invention.

FIG. 2 shows a cross-sectional view that illustrates a CMOS logic circuit 100 in accordance with the present invention. As shown in FIG. 2, circuit 100 includes a PMOS transistor 120 and a Frohmann-Bentchkowsky EPROM cell 140 which are formed in an n-well 114, and an NMOS transistor 160 which is formed in a p-type well 116. In addition, n-well 114 and p-well 116 are formed in a p-type substrate 112. (Although circuit 100 is described as being formed in a twin-well that includes n-well 114 and p-well 116, circuit 100 may alternately be formed in a single well where transistor/cell 120/140, or transistor 160, is formed directly in the substrate).

As further shown in FIG. 2, transistor 120 and cell 140 each have spaced-apart p-type source and drain regions 122/124 and 142/144, respectively, which are formed in n-well 114, while transistor 160 has spaced-apart n-type source and drain regions 162 and 164 which are formed in p-well 116. (P-type source and drain regions 122/124 and 142/144 are shown in FIG. 2 as including PLDD regions 122'/124' and 142'/144', while N-type source and drain regions 162 and 164 are shown as including NLDD regions 162' and 164'. Alternately, halo-type LDD structures may also be used.)

In addition, transistor 120, cell 140, and transistor 160 each have a channel region 126, 146, and 166, respectively, which is defined between source and drain regions 122/124, 142/144, and 162/164, respectively.

Further, transistor 120, cell 140, and transistor 160 each have a layer of gate oxide 128, 148, and 168, respectively, which is formed over channel region 126, 146, and 166, respectively, and a gate 130, 150, and 170, respectively, which is formed over gate oxide layer 128, 148, and 168, respectively. In addition, oxide spacers 132, 152, and 172 are formed along the sidewalls of gates 130, 150, and 170, respectively.

In accordance with the present invention, NMOS transistor 160 is formed to have a physical gate length L1, which is equal to the minimum physical gate length, while cell 140 is formed to have a physical gate length L2 which is smaller than length L1. In addition, PMOS transistor 120 is formed to have a physical gate length which is greater than the physical gate length L2 of the floating gate of cell 140.

Conventionally, the design rule or process technology that is used to form MOS transistors defines a minimum physical gate length. The minimum physical gate length is not the smallest feature size that is photolithographically obtainable, but is the smallest feature size that is allowed under the rule for CMOS devices.

Thus, for example, a 0.35 micron design rule or process technology defines a minimum physical gate length of 0.35 microns for the NMOS transistors. Similarly, a 0.25 micron design rule or process defines a minimum physical gate length of 0.25 microns for the NMOS transistors. As a result, the minimum physical gate length is commonly used to identify the design rule or process technology that is used to form MOS transistors.

Figure 3:
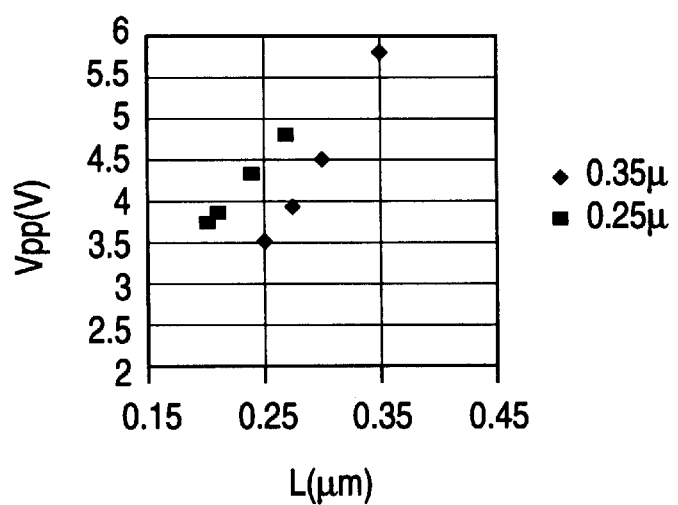
FIG. 3 is a graph illustrating a series of programming voltages versus physical floating gate lengths in accordance with the present invention.

FIG. 3 shows a graph that illustrates a series of programming voltages versus physical floating gate lengths in accordance with the present invention. As shown in FIG. 3, with a physical floating gate length of 0.25 microns based on a 0.35 micron design rule or technology (and conventional doping concentrations for the well, source, and drain), holes flowing from source region 142 to drain region 144 become hot when drain 144 is grounded and the voltage applied to well 114 and source region 142 is equal to approximately 3.5 volts.

CMOS devices fabricated with a 0.35 micron design rule conventionally use a power supply which has an average voltage of 3.3 volts and a maximum voltage of approximately 3.6 volts. Thus, by shortening the physical gate length of cell 140 (which also shortens the channel length) with respect to the design rule or technology, cell 140 can be programmed with the existing CMOS power supply.

Further, the maximum voltage rating, which is the maximum voltage that can be applied for a short period of time without destroying the device, is approximately 4.6 volts with a 0.35 micron design rule. Thus, if 4.5 volts can be obtained from an external or other power supply, cell 140 can be formed with a physical gate length which is only slightly less than the design rule, e.g., approximately 0.30 microns.

Similarly, as extrapolated from FIG. 3, with a physical gate length of 0.15 microns based on a 0.25 micron design rule or technology (and conventional doping concentrations for the well, source, and drain), holes flowing from source region 142 to drain region 144 become hot when the voltage applied to well 114 and source region 142 is equal to approximately 2.7 volts.

CMOS devices fabricated with a 0.25 micron design rule conventionally use a power supply which has an average voltage of 2.5 volts, a maximum voltage of approximately 2.75 volts, and a maximum voltage rating in excess of 3.25 volts. Thus, by shortening the physical gate length with respect to the design rule, cell 140 can be programmed by voltages that do not exceed the maximum voltage rating for the design rule.

Further, the Frohmann-Bentchkowsky EPROM cell of the present invention is integratable into a standard CMOS fabrication process without any additional process steps. The cell of the present invention primarily differs from a conventional CMOS transistor in that the physical gate length is shorter (and the gate is electrically isolated).

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A logic circuit comprising:
   a memory cell formed in a first semiconductor material of a first conductivity type, the memory cell having:
      spaced-apart source and drain regions of a second conductivity type formed in the first semiconductor material;
      a channel region defined between the source and drain regions;
      a layer of gate oxide formed over the channel region; and
      a floating gate formed over the layer of gate oxide, the floating gate having a physical gate length;
   a first transistor formed in a second semiconductor material of the second conductivity type, the second semiconductor material contacting the first semiconductor material, the first transistor having:
      spaced-apart source and drain regions of a first conductivity type formed in the second semiconductor material;
      a channel region defined between the source and drain regions of the first transistor;
      a layer of gate oxide formed over the channel region of the first transistor; and
      a first transistor gate formed over the layer of gate oxide of the first transistor, the first transistor gate having a physical gate length that is greater than the physical gate length of the floating gate; and
   a second transistor formed in the first semiconductor material, the second transistor having:
      spaced-apart source and drain regions of the second conductivity type formed in the first semiconductor material;
      a channel region defined between the source and drain regions of the second transistor;
      a layer of gate oxide formed over the channel region of the second transistor; and
      a second transistor gate formed over the layer of gate oxide of the second transistor, the second transistor gate having a physical gate length that is greater than the physical gate length of the floating gate.

2. A logic circuit comprising:
   a memory cell formed in a first semiconductor material of a first conductivity type, the memory cell having:
      spaced-apart source and drain regions of a second conductivity type formed in the first semiconductor material;
      a channel region defined between the source and drain regions;
      a layer of gate oxide formed over the channel region; and
      a floating gate formed over the layer of gate oxide, the floating gate having a physical gate length;
   a first transistor formed in the first semiconductor material, the first transistor having:
      spaced-apart source and drain regions of the second conductivity type formed in the first semiconductor material;
      a channel region defined between the source and drain regions of the first transistor;
      a layer of gate oxide formed over the channel region of the first transistor; and
      a first transistor gate formed over the layer of gate oxide of the first transistor, the first transistor gate having a physical gate length that is greater than the physical gate length of the floating gate; and
   a second transistor formed in a second semiconductor material of the second conductivity type, the second semiconductor material contacting the first semiconductor material, the second transistor having:
      spaced-apart source and drain regions of the first conductivity type formed in the second semiconductor material;
      a channel region defined between the source and drain regions of the second transistor;
      a layer of gate oxide formed over the channel region of the second transistor; and
      a second transistor gate formed over the layer of gate oxide of the second transistor, the second transistor gate having a physical gate length that is greater than the physical gate length of the floating gate.

3. The logic circuit of claim 1 wherein the semiconductor material of the first conductivity type is a well formed in a substrate.

4. The logic circuit of claim 1 wherein the semiconductor material of the first conductivity type is a well formed in a substrate, and the semiconductor material of the second conductivity type is a well formed in the substrate.

* * * * *